(12) United States Patent
Oh et al.

(10) Patent No.: US 11,335,802 B2
(45) Date of Patent: May 17, 2022

(54) HIGH ELECTRON MOBILITY TRANSISTOR AND METHOD OF MANUFACTURING THE SAME

(71) Applicant: Samsung Electronics Co., Ltd., Suwon-si (KR)

(72) Inventors: Jaejoon Oh, Seongnam-si (KR); Jongseob Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 2 days.

(21) Appl. No.: 17/016,890

(22) Filed: Sep. 10, 2020

(65) Prior Publication Data
US 2021/0336045 A1    Oct. 28, 2021

(30) Foreign Application Priority Data
Apr. 24, 2020   (KR) .................. 10-2020-0050342

(51) Int. Cl.
| | |
|---|---|
| *H01L 29/778* | (2006.01) |
| *H01L 29/10* | (2006.01) |
| *H01L 29/423* | (2006.01) |
| *H01L 29/45* | (2006.01) |
| *H01L 29/47* | (2006.01) |
| *H01L 29/66* | (2006.01) |
| H01L 29/20 | (2006.01) |
| H01L 29/205 | (2006.01) |

(52) U.S. Cl.
CPC .......... *H01L 29/7787* (2013.01); *H01L 29/10* (2013.01); *H01L 29/42312* (2013.01); *H01L 29/452* (2013.01); *H01L 29/475* (2013.01); *H01L 29/66462* (2013.01); *H01L 29/2003* (2013.01); *H01L 29/205* (2013.01)

(58) Field of Classification Search
CPC ................. H01L 29/7787; H01L 29/10; H01L 29/42312; H01L 29/452; H01L 29/475; H01L 29/66462; H01L 29/2003; H01L 29/205; H01L 29/1066; H01L 29/7786
See application file for complete search history.

(56) References Cited

U.S. PATENT DOCUMENTS

| | | |
|---|---|---|
| 8,633,494 B2 | 1/2014 | Nishimori et al. |
| 8,716,754 B2 | 5/2014 | Park et al. |
| (Continued) | | |

FOREIGN PATENT DOCUMENTS

| | | |
|---|---|---|
| EP | 2923382 A1 | 9/2015 |
| JP | 6090361 B2 | 3/2017 |
| (Continued) | | |

OTHER PUBLICATIONS

Extended European Search Report dated Mar. 11, 2021 in European Application No. 20195816.2.

*Primary Examiner* — Mohammed R Alam
(74) *Attorney, Agent, or Firm* — Harness, Dickey & Pierce, P.L.C.

(57) ABSTRACT

Provided are a high electron mobility transistor and a method of manufacturing the high electron mobility transistor. The high electron mobility transistor includes a gate electrode provided on a depletion forming layer. The gate electrode includes a first gate electrode configured to form an ohmic contact with the depletion forming layer, and a second gate electrode configured to form a Schottky contact with the depletion forming layer.

25 Claims, 28 Drawing Sheets

(56) References Cited

U.S. PATENT DOCUMENTS

| | | |
|---|---|---|
| 9,379,227 B2 | 6/2016 | Lee et al. |
| 10,204,778 B2 | 2/2019 | Odnoblyudov et al. |
| 2003/0098462 A1* | 5/2003 | Yoshida ............... H01L 29/475 |
| | | 257/183 |
| 2005/0110042 A1 | 5/2005 | Saito et al. |
| 2016/0380091 A1* | 12/2016 | Okawa ............... H01L 29/7788 |
| | | 257/194 |
| 2018/0218910 A1* | 8/2018 | Harada ............... H01L 29/0684 |
| 2019/0267482 A1 | 8/2019 | Udrea et al. |

FOREIGN PATENT DOCUMENTS

| | | |
|---|---|---|
| KR | 10-1882997 | 7/2018 |
| KR | 10-2036349 | 10/2019 |

* cited by examiner

HIGH ELECTRON MOBILITY TRANSISTOR AND METHOD OF MANUFACTURING THE SAME

CROSS-REFERENCE TO RELATED APPLICATION

This application claims the benefit of Korean Patent Application No. 10-2020-0050342, filed on Apr. 24, 2020, in the Korean Intellectual Property Office, the disclosure of which is incorporated herein in its entirety by reference.

BACKGROUND

1. Field

The present disclosure relates to a high electron mobility transistor and a method of manufacturing the high electron mobility transistor.

2. Description of Related Art

Devices for current control through ON/OFF switching (e.g. power devices) are generally required in various power conversion systems. The overall efficiency of power conversion systems may be determined by the efficiency of power devices.

It is difficult to increase the efficiency of silicon (Si)-based power devices due to limitations in physical properties of silicon and manufacturing processes. To overcome these limitations, the application of Group III-V compound semiconductors, such as GaN, in power devices has been researched and developed as a method of increasing conversion efficiency. Recently, high electron mobility transistors (HEMTs) using a heterojunction structure of compound semiconductors have been researched.

SUMMARY

Provided are high electron mobility transistors and methods of manufacturing the high electron mobility transistors.

Additional aspects will be set forth in part in the description which follows and, in part, will be apparent from the description, or may be learned by practice of the presented example embodiments of the disclosure.

According to an aspect of an example embodiment, a high electron mobility transistor includes:

a channel layer including a first semiconductor material;

a channel supply layer including a second semiconductor material and inducing 2-dimensional electron gas (2DEG) in the channel layer;

source and drain electrodes electrically connected to the 2DEG;

a depletion forming layer on the channel supply layer, the depletion forming layer configured to form a depletion region in the 2DEG; and a gate electrode on the depletion forming layer, the gate electrode including a first gate electrode configured to form an ohmic contact with the at least one depletion forming layer; and a second gate electrode configured to form a Schottky contact with the depletion forming layer.

The depletion forming layer may include a p-type Group III-V nitride semiconductor.

The depletion forming layer may extend in a direction parallel to the source and drain electrodes.

The high electron mobility transistor may further comprise a protrusion may be on a middle portion of the depletion forming layer. The protrusion may extend in the direction parallel to the source and drain electrodes.

The first gate electrode may extend in a middle region on an upper surface of the depletion forming layer in the direction parallel to the source and drain electrodes.

The second gate electrode may be on the upper surface of the depletion forming layer and cover the first gate electrode.

The first gate electrode may include at least one of palladium and titanium nitride (TiN); the second gate electrode may include TiN; and the ration of titanium to nitride in the first gate electrode may be different from a ratio of titanium to nitride in the second gate electrode.

The second gate electrode may be one of a plurality of second gate electrodes spaced apart from each other on the upper surface of the depletion forming layer and cover portions of the first gate electrode.

The first gate electrode may be one of a plurality of first gate electrodes spaced apart from each other in a middle region on an upper surface of the depletion forming layer in the direction parallel to the source and drain electrodes.

The at least one second gate electrode may include a second gate electrode on the upper surface of the depletion forming layer and may cover the plurality of first gate electrodes.

The at depletion forming layer may be one of a plurality of depletion forming layers, the plurality of depletion forming layers may be spaced apart from each other in a direction parallel to the source and drain electrodes.

A plurality of protrusions may be respectively on middle portions of the plurality of depletion forming layers in the direction parallel to the source and drain electrodes.

The first gate electrode may be one of a plurality of first gate electrodes in middle regions on upper surfaces of the plurality of depletion forming layers.

The second gate electrode may be on the upper surfaces of the plurality of depletion forming layers to cover the plurality of first gate electrodes.

The first semiconductor material may include a GaN-based material. The second semiconductor material may include a nitride including at least one of aluminum (Al), gallium (Ga), indium (In), and boron (B). The nitride may include at least one of aluminum gallium nitride (AlGAN), aluminum indium nitride (AlInN), indium gallium nitride (InGAN), aluminum nitride (AlN), and aluminum indium gallium nitride (AlInGAN).

A current, in the high electron mobility transistor, between the source and drain electrodes may be cut off when a voltage applied to the gate electrode is 0 V.

The first semiconductor material and the second semiconductor material may differ in at least one of their polarization characteristics, energy bandgaps, and lattice constants.

According to an aspect of another embodiment, there is provided a method of manufacturing a high electron mobility transistor, the method including:

forming a channel layer and a channel supply layer;

forming a depletion forming layer on the channel supply layer;

forming a first gate electrode on the at least one depletion forming layer to form an ohmic contact; and forming a second gate electrode on the depletion forming layer and the first gate electrode, the second gate electrode configured to form a Schottky contact.

The depletion forming layer may include a p-type group III-V nitride semiconductor.

The method may further include forming a protrusion in a middle region on an upper surface of the depletion forming layer.

The first gate electrode may be formed in a middle region on an upper surface of the depletion forming layer.

The at least one second gate electrode may be formed on the depletion forming layer and cover the first gate electrode.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
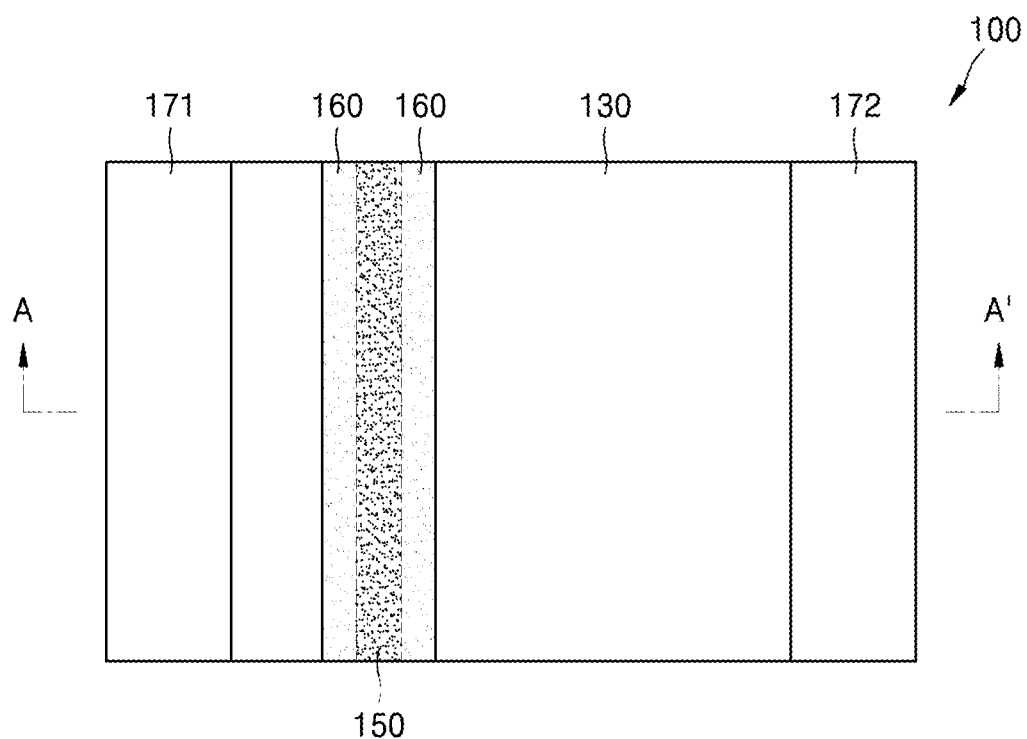
FIG. 1 is a plan view illustrating a high electron mobility transistor according to an example embodiment.

Reference will now be made in detail to example embodiments, examples of which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in an appropriate order unless explicitly described in terms of order or described to the contrary, and are not limited to the stated order thereof.

In the present disclosure, terms such as "unit" or "module" may be used to denote a unit that has at least one function or operation and is implemented with hardware, software, or a combination of hardware and software.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples and/or exemplary terms are just used herein to describe technical ideas and should not be considered for purposes of limitation unless defined by the claims.

High electron mobility transistors (HEMTs) include semiconductor layers having different electrical polarization characteristics. In a high electron mobility transistor, a first semiconductor layer, having relatively great polarizability, may induce the formation of a 2-dimensional electron gas (2DEG) in another (e.g., second) semiconductor layer coupled to the first semiconductor layer. The resulting 2DEG may have high electron mobility.

When the gate voltage of a high electron mobility transistor is 0 V, the high electron mobility transistor may be in a normally-on state in which current flows because the resistance between the drain electrode and the source electrode of the high electron mobility transistor is low. This situation results in consumption of current and power, and it may be required to apply a negative voltage to a gate electrode to cut off the current flowing between the drain electrode and the source electrode. As a method of addressing this situation, a depletion forming layer may be used to bring a high electron mobility transistor into a normally-off state in which current between the source and drain electrodes the high electron mobility transistor is cut off when the gate voltage of the high electron mobility transistor is 0 V.

Figure 2:
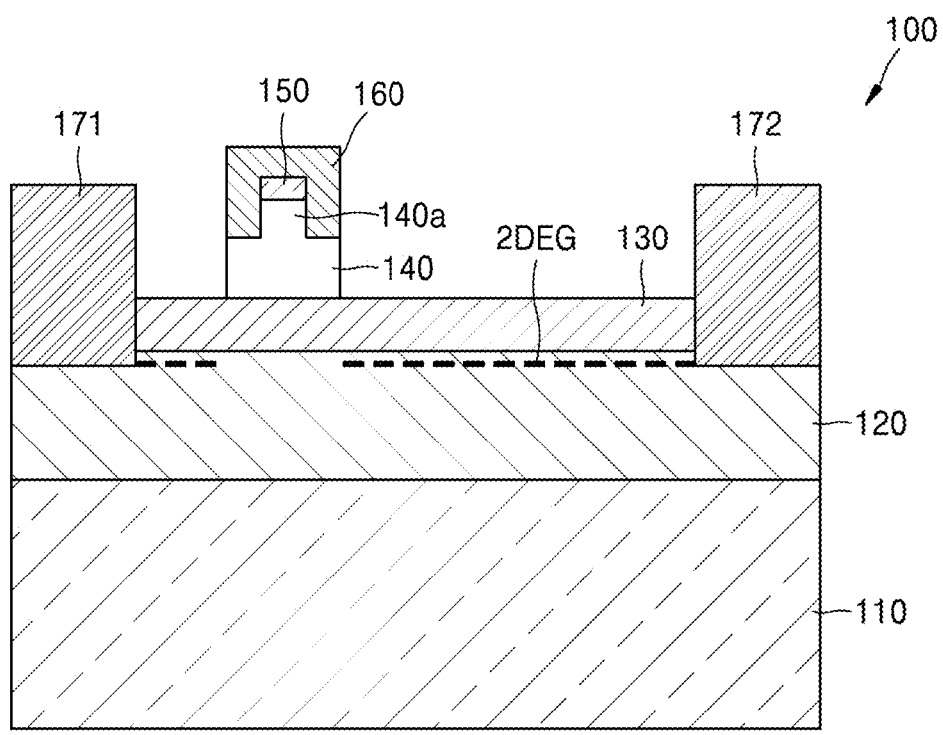
FIG. 2 is a cross-sectional view taken along line A-A' of FIG. 1.

FIG. 1 is a plan view illustrating a high electron mobility transistor 100 according to an example embodiment. FIG. 2 is a cross-sectional view taken along line A-A' of FIG. 1.

Referring to FIGS. 1 and 2, a channel layer 120 may be on a substrate 110. The substrate 110 may include, for example, sapphire, silicon (Si), silicon carbide (SiC), and/or gallium nitride (GaN). However, the above-mentioned materials are examples, and the substrate 110 may include various other materials.

The channel layer 120 may include a first semiconductor material. For example, the first semiconductor material may include a Group III-V compound semiconductor material, but is not limited thereto. For example, the channel layer 120 may include a GaN and/or GaN-based material layer. The channel layer 120 may include a dopant. For example, in the case wherein the channel layer 120 includes GaN, the channel layer 120 may include an undoped GaN layer, and/or, in some cases, the channel layer 120 may include a GaN layer doped with a dopant.

Although not illustrated in FIGS. 1 and 2, a buffer layer may be between the substrate 110 and the channel layer 120. The buffer layer may alleviate stress due to a lattice constant difference and/or a thermal expansion coefficient difference between the substrate 110 and the channel layer 120. The buffer layer may include a nitride. For example the buffer layer may include a nitride. The nitride may include at least one of aluminum (Al), gallium (Ga), indium (In), and boron (B), and may have a single-layer or multilayer structure. For example, the buffer layer may include at least one of AlN, GaN, AlGaN, InGaN, AlInN, and AlInGaN. A seed layer (not shown) for growing the buffer layer may be further provided between the substrate 110 and the buffer layer.

A channel supply layer 130 may be on the channel layer 120. The channel supply layer 130 may induce 2DEG in the channel layer 120. Here, the 2DEG may be formed in the channel layer 120 below the interface between the channel layer 120 and the channel supply layer 130. The channel supply layer 130 may include a second semiconductor material. The second semiconductor material may be different from the first semiconductor material of the channel layer 120. For example, the second semiconductor material may be different from the first semiconductor material in at least one of polarization characteristics, energy bandgap, and/or lattice constant.

For example, at least one of the polarizability and/or the energy bandgap of the second semiconductor material may be greater than the polarizability and/or the energy bandgap of the first semiconductor material, respectively. The channel supply layer 130 may include, for example, a nitride including at least one of aluminum (Al), gallium (Ga), indium (In), and boron (B), and may have a single-layer or multilayer structure. For example, the channel supply layer 130 may include at least of AlGaN, AlInN, InGaN, AlN, and AlInGaN. However, the supply layer 130 is not limited thereto. The channel supply layer 130 may include a dopant. For example, the channel supply layer 130 may include an undoped layer and/or a layer doped with a dopant.

A source electrode 171 and a drain electrode 172 may be electrically connected to the 2DEG. For example, the source electrode 171 and the drain electrode 172 may be parallel to each other at both sides of the channel supply layer 130, and/or the source electrode 171 and the drain electrode 172 may be on the channel supply layer 130.

A depletion forming layer 140 may be on the channel supply layer 130 between the source electrode 171 and the drain electrode 172. The depletion forming layer 140 may be of a one-piece type extending in a direction parallel to the source electrode 171 and the drain electrode 172.

A protrusion 140a may be in a middle region on an upper surface of the depletion forming layer 140. The protrusion 140a may be of a one-piece type extending in a direction parallel to the source and drain electrodes 171 and 172. For example, the protrusion 140a may extend the length of the depletion forming layer 140.

The depletion forming layer 140 may include a p-type semiconductor material. For example, the depletion forming layer 140 may be a semiconductor layer doped with a p-type dopant. The depletion forming layer 140 may include a Group III-V nitride semiconductor. The depletion forming layer 140 may include, for example, at least one of GaN, AlGaN, InN, AlInN, InGaN, and AlInGaN doped with a p-type dopant. For example, the depletion forming layer 140 may include a p-GaN layer.

Because the depletion forming layer 140 may increase the energy bandgap of a portion of the channel supply layer 130 which is under the depletion forming layer 140, a depletion region of the 2DEG may be formed in a portion of the channel layer 120 corresponding to the depletion forming layer 140. Therefore, a portion of the 2DEG corresponding to the depletion forming layer 140 may be cut off or have characteristics (for example, electron concentration, etc.) that are different from the characteristics of the other portion thereof. A region in which the 2DEG is cut may be referred to as a "break region," and owing to the break region, a normally-off state may be obtained in which current between the drain electrode 172 and the source electrode 171 is cut off when the gate voltage of the high electron mobility transistor 100 is 0 V.

A gate electrode may be on the depletion forming layer 140. The gate electrode may include first and second gate electrodes 150 and 160. The first gate electrode 150 may contact with an upper surface of the protrusion 140a of the depletion forming layer 140. The first gate electrode 150 may be of a one-piece type extending along the protrusion 140a of the depletion forming layer 140.

The first gate electrode 150 may form an ohmic contact with the depletion forming layer 140. When the depletion forming layer 140 includes a p-type semiconductor material, the first gate electrode 150 may include a material having a higher work function than the depletion forming layer 140. For example, when the depletion forming layer 140 is a p-GaN layer, the first gate electrode 150 may include, for example, palladium (Pd) and/or TiN. TiN may have a work function adjustable according to the ratio of titanium (Ti)

and nitrogen (N). The above-mentioned materials are merely examples, and the first gate electrode 150 may include various other materials.

The second gate electrode 160 may be on the depletion forming layer 140 and may cover the first gate electrode 150. The second gate electrode 160 may contact both sides of the protrusion 140*a* of the depletion forming layer 140 and the upper surface of the depletion forming layer 140 adjacent to the protrusion 140*a*. The second gate electrode 160 may be of a one-piece type extending along the first gate electrode 150.

The second gate electrode 160 may form a Schottky contact with the depletion forming layer 140. Here, as described later, the second gate electrode 160 may have a function of preventing an increase in the leakage of current through the gate electrode when a high voltage is applied to the gate electrode (for example, to the first and second gate electrodes 150 and 160).

When the depletion forming layer 140 includes a p-type semiconductor material, the second gate electrode 160 may include a material having a lower work function than the depletion forming layer 140. For example, when the depletion forming layer 140 is a p-GaN layer, the second gate electrode 160 may include, for example, TiN. The above-mentioned material is merely an example, and the second gate electrode 160 may include various other materials.

The second gate electrode 160 may have a function of preventing an increase in the leakage of current through the gate electrode when a high voltage (in a non-limiting example, about 3 V or higher) is applied to the gate electrode to turn on the high electron mobility transistor 100.

For example, the second gate electrode 160 may form a Schottky junction with the depletion forming layer 140. In this case, when a high voltage is applied to the gate electrode, a depletion region may expand at the Schottky junction, and thus current leaking from the gate electrode to the depletion forming layer 140 may be limited and/or prevented. Here, the amount of leakage current may be adjusted by changing the area ratio and the height of the Schottky contact (e.g. the area ratio and the height of the second gate electrode 160 making contact with the depletion forming layer 140).

Figure 3A:
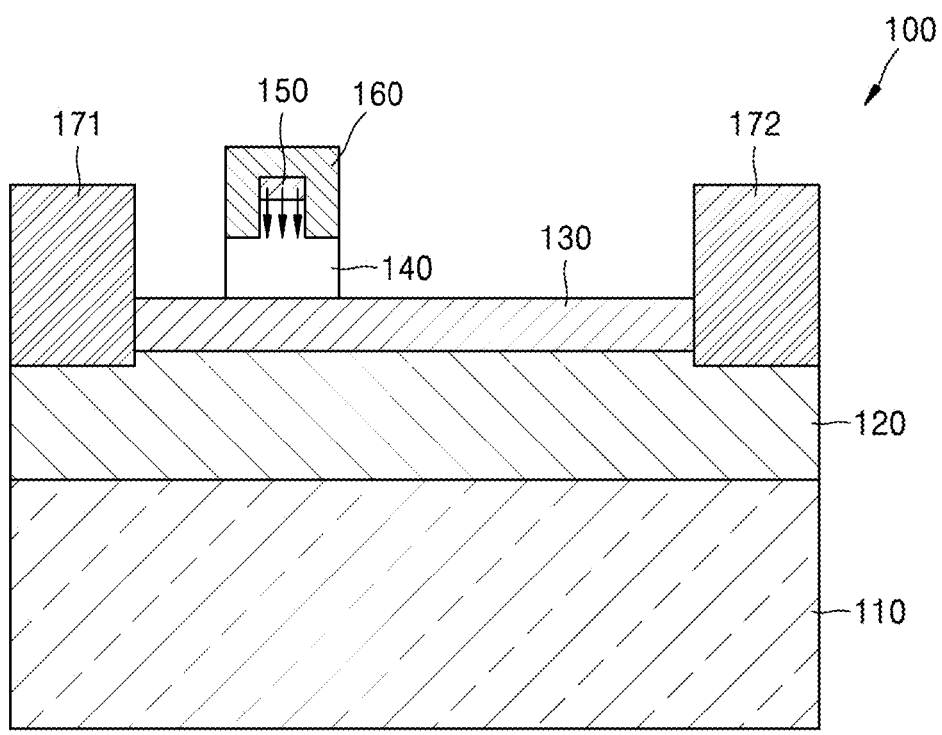
FIGS. 3A and 3B are views illustrating the flow of gate leakage current according to turn-on voltages applied to a gate electrode of the high electron mobility transistor shown in FIG. 1.
Figure 3B:
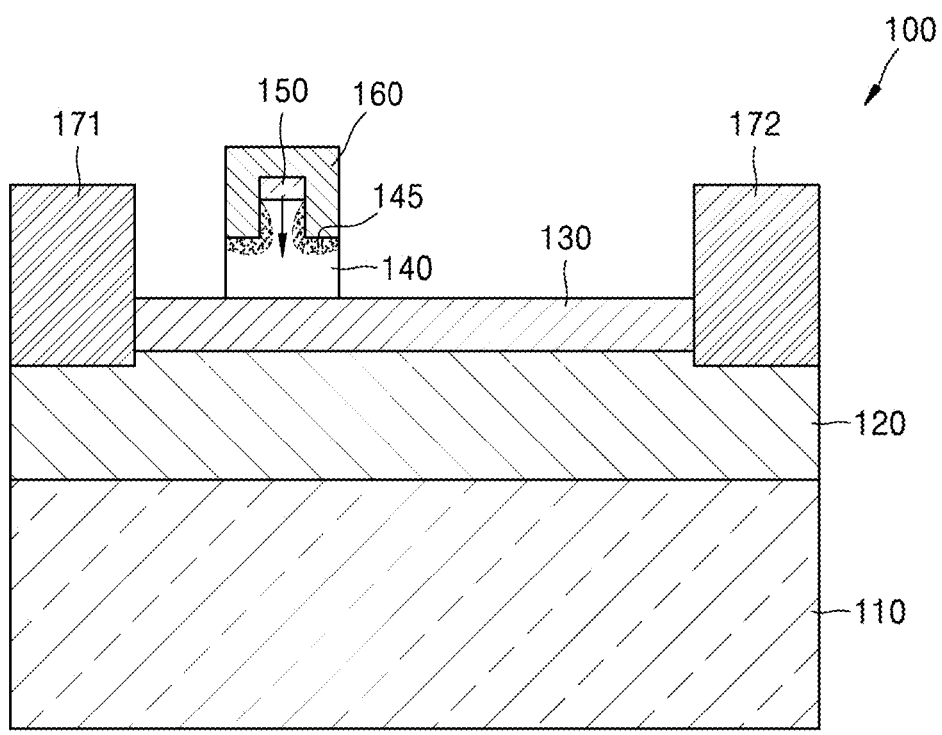

FIGS. 3A and 3B illustrate the flow of gate leakage current according to turn-on voltages applied to the gate electrode of the high electron mobility transistor 100 shown in FIGS. 1 and 2.

FIG. 3A illustrates the flow of gate leakage current when a low voltage is applied to the gate electrode. FIG. 3B illustrates the flow of gate leakage current when a high voltage is applied to the gate electrode.

As illustrated in FIG. 3A, when a low voltage is applied to the gate electrode, a depletion region is only limitedly formed at the Schottky junction between the depletion forming layer 140 and the second gate electrode 160, and thus, the flow of leakage current through the gate electrode may be allowed. However, as illustrated in FIG. 3B, when a high voltage is applied to the gate electrode, a depletion region 145 expands at the Schottky junction between the depletion forming layer 140 and the second gate electrode 160, and thus, the flow of leakage current through the gate electrode may be limited.

Figure 4:
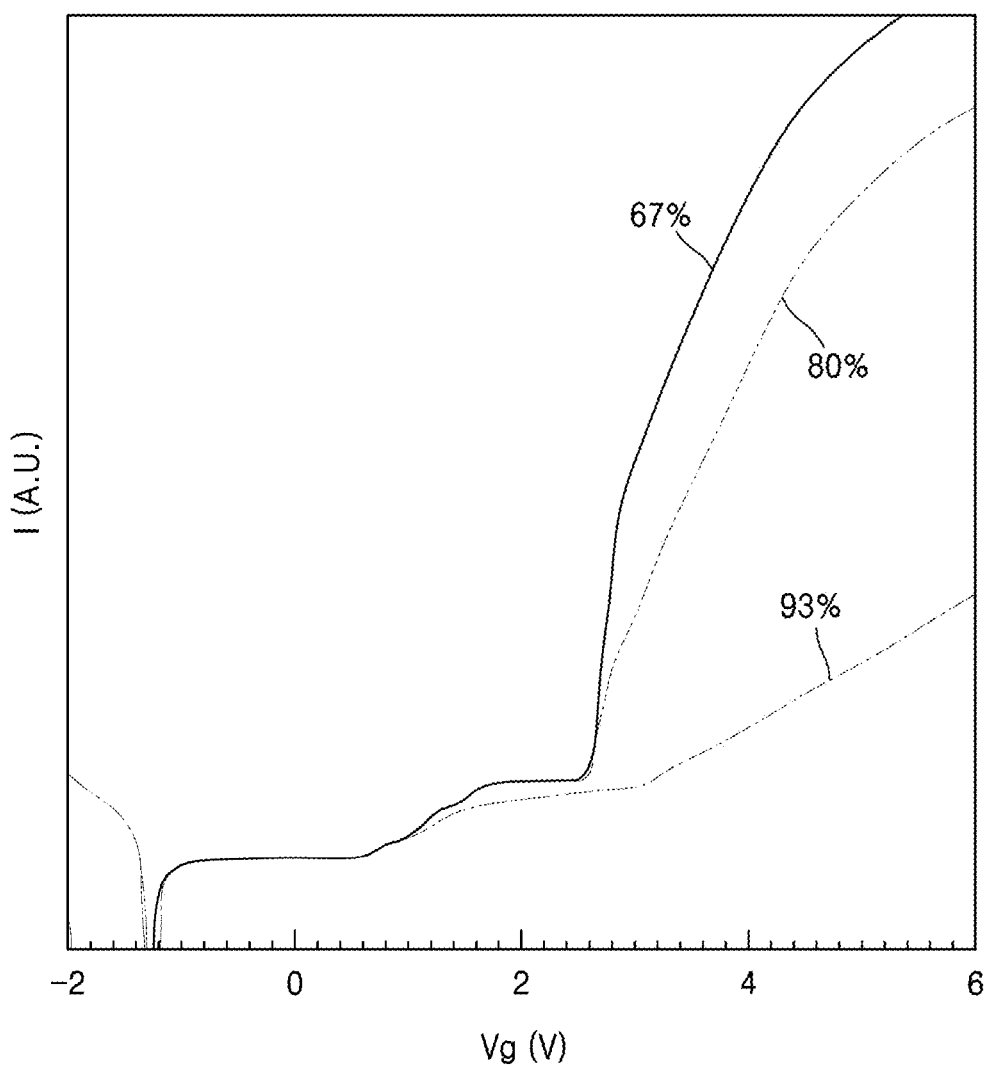
FIG. 4 is a view illustrating results of a simulation of gate leakage current according to the area of a Schottky contact in the high electron mobility transistor shown in FIG. 1.

FIG. 4 illustrates results of a simulation of gate leakage current according to the area of the Schottky contact in the high electron mobility transistor 100 shown in FIGS. 1 and 2. FIG. 4 illustrates results measured when the height of the Schottky contact is 50 nm, and the area ratio of the Schottky contact is 67%, 80%, and 93%. Here, the height of the Schottky contact refers to the height of the area of the second gate electrode 160 in contact with both sides of the protrusion 140*a* of the depletion forming layer 140 relative to the total height of the depletion forming layer 140. In addition, the area ratio of the Schottky contact refers to the ratio of an area of the depletion forming layer 140 making contact with the second gate electrode 160 to an area of the depletion forming layer 140 making contact with the first and second gate electrodes 150 and 160.

Referring to FIG. 4, it may be understood that when the gate voltage Vg is high at about 3 V or greater, the gate leakage current (I) decreases as the area ratio of the Schottky contact increases.

As discussed above, in the high electron mobility transistor 100 of the present embodiment, the first gate electrode 150 configured to form an ohmic contact and the second gate electrode 160 configured to form a Schottky contact are on the depletion forming layer 140, and when a high voltage is applied to the gate electrode, the depletion region 145 expands at the Schottky junction between the depletion forming layer 140 and the second gate electrode 160 such that current leaking through the gate electrode may not increase.

Furthermore, in the present embodiment, the amount of leakage current may be adjusted by controlling factors such as the area ratio and the height of the Schottky contact formed by the second gate electrode 160. For example, when a certain amount of leakage current is required to reduce the turn-on resistance of the high electron mobility transistor 100, gate current may be increased as desired by adjusting the area ratio and the height of the Schottky contact. In addition, for example, a gate bias voltage may be increased to about 10 V or greater.

FIGS. 5 to 8 are views illustrating a method of manufacturing the high electron mobility transistor 100 shown in FIG. 1. Each layer shown in FIGS. 5 to 8 may be formed by, for example, metal-organic chemical vapor deposition (MOCVD), but is not limited thereto.

Figure 5:
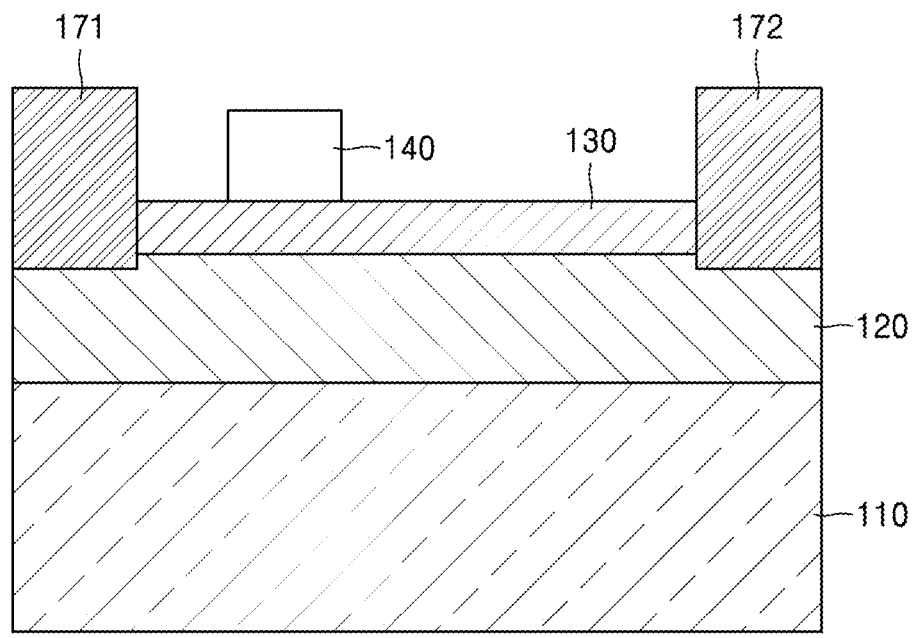
FIGS. 5 to 8 are views illustrating a method of manufacturing the high electron mobility transistor shown in FIG. 1.

Referring to FIG. 5, a channel layer 120 and a channel supply layer 130 are sequentially deposited on a substrate 110. The channel layer 120 may include a first semiconductor material. Here, the first semiconductor material may include a Group III-V compound semiconductor material, but is not limited thereto.

The channel supply layer 130 may include a second semiconductor material that is different from the first semiconductor material of the channel layer 120. The second semiconductor material may be different from the first semiconductor material in at least one of polarization characteristics, energy bandgap, and lattice constant. For example, the channel supply layer 130 may include at least a nitride of aluminum (Al), gallium (Ga), indium (In), and/or boron (B).

A source electrode 171 and a drain electrode 172 are formed on the channel layer 120 at both sides of the channel supply layer 130. The source electrode 171 and the drain electrode 172 may be formed in various forms, and the formation order thereof may be variously modified.

Next, a depletion forming layer 140 is deposited on the channel supply layer 130, and then the depletion forming layer 140 is etched. The depletion forming layer 140 may also be deposited using a mask. The depletion forming layer 140 may include a p-type semiconductor material. The depletion forming layer 140 may be of a one-piece type extending in a direction parallel to the source electrode 171 and the drain electrode 172.

Figure 6:
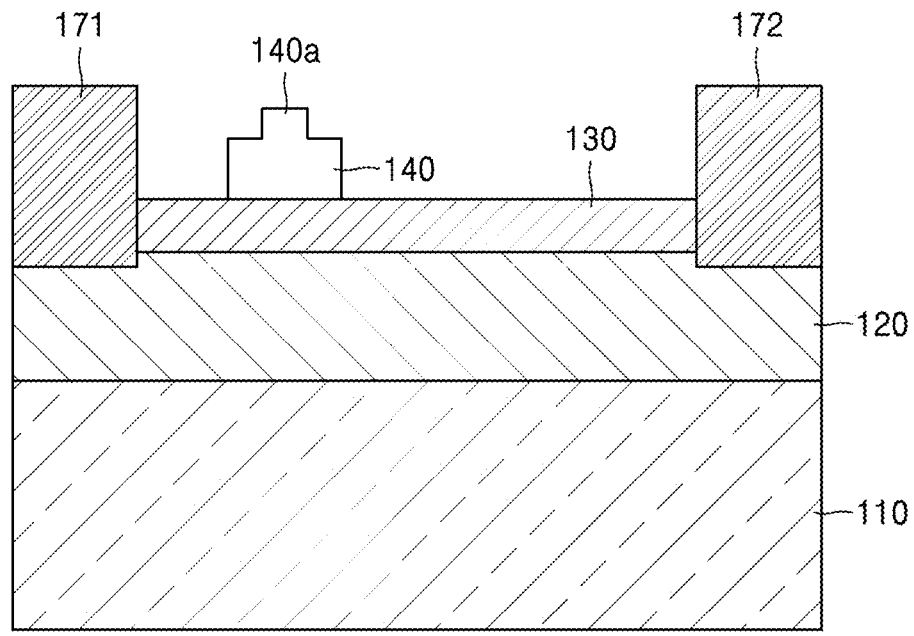

Referring to FIG. 6, a protrusion 140a may be formed on a middle portion of the depletion forming layer 140 by etching both lateral portions of the depletion forming layer 140. Here, the protrusion 140a may extend along the depletion forming layer 140 in one piece with the depletion forming layer 140.

Figure 7:
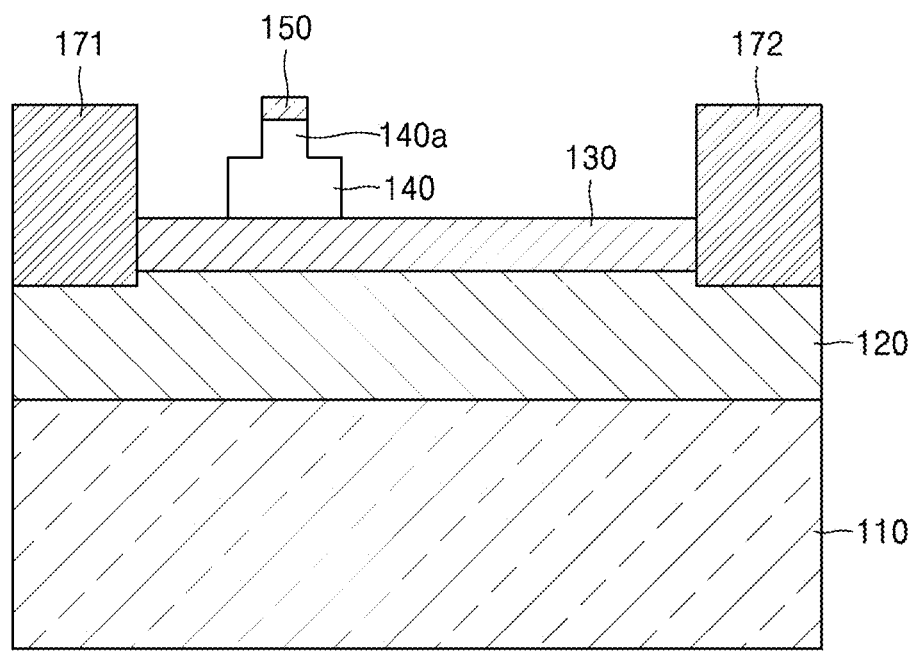

Referring to FIG. 7, a first gate electrode 150 may be formed on an upper surface of the protrusion 140a of the depletion forming layer 140. The first gate electrode 150 may include a material capable of forming an ohmic contact with the depletion forming layer 140. For example, when the depletion forming layer 140 is a p-GaN layer, the first gate electrode 150 may include, for example, palladium (Pd) and/or TiN.

Figure 8:
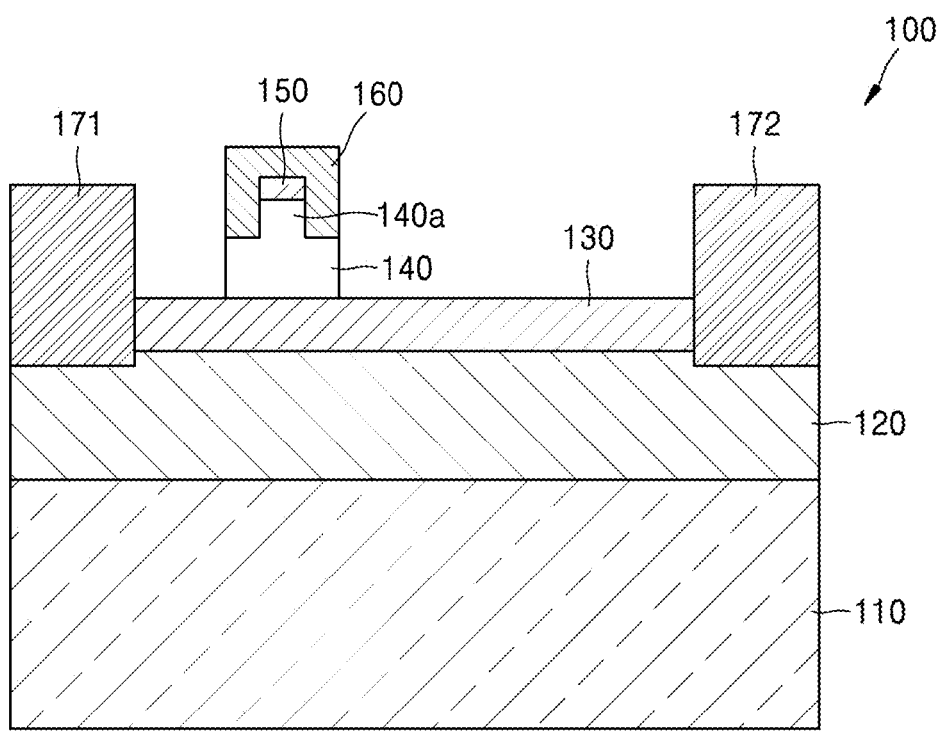

Referring to FIG. 8, a second gate electrode 160 may be formed on the depletion forming layer 140 to cover the first gate electrode 150. The second gate electrode 160 may include a material capable of forming a Schottky junction with the depletion forming layer 140. For example, when the depletion forming layer 140 is a p-GaN layer, the second gate electrode 160 may include, for example, TiN, but is not limited thereto.

In the above, the case in which the protrusion 140a is formed on the depletion forming layer 140 is described, but the protrusion 140a may not be formed on the depletion forming layer 140 as described below. Furthermore, in the above example, the case in which the depletion forming layer 140 and the protrusion 140a are of a one-piece type is described, but a plurality of depletion forming layers (not shown) separated apart from each other and/or a plurality of protrusions (not shown) separated apart from each other may be formed at predetermined intervals in a direction parallel to the source electrode 171 and the drain electrode 172 as described below. In addition, although the case in which the first and second gate electrodes 150 and 160 are of a one-piece type is described above, a plurality of first gate electrodes (not shown) separated apart from each other and/or a plurality of second gate electrodes (not shown) separated apart from each other may be formed at predetermined intervals in a direction parallel to the source electrode 171 and the drain electrode 172 as described below.

Figure 9:
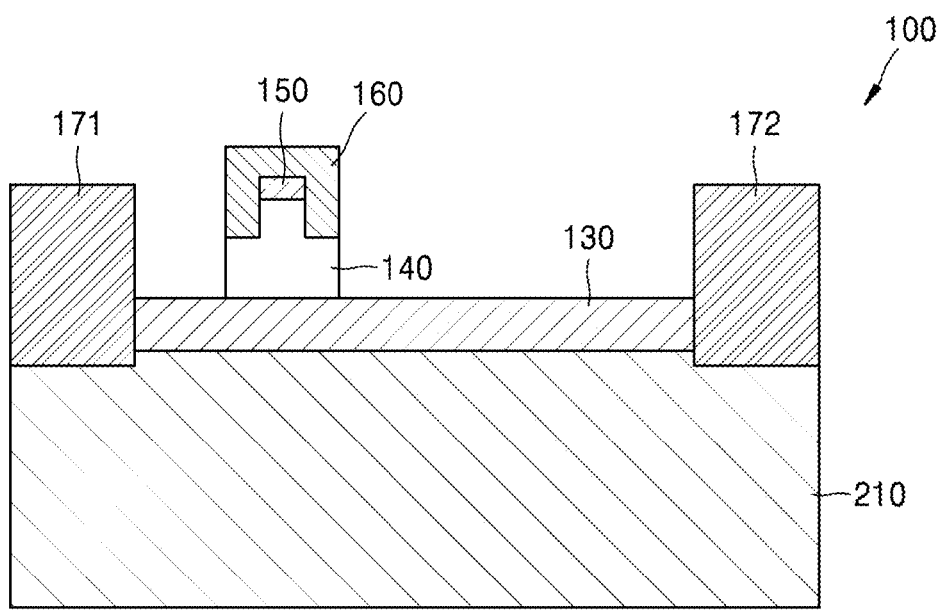
FIG. 9 is a view illustrating a high electron mobility transistor according to another example embodiment.

FIG. 9 illustrates a high electron mobility transistor 100 according to another example embodiment. The high electron mobility transistor 100 shown in FIG. 9 is substantially the same as the high electron mobility transistor 100 shown in FIG. 2 except that a substrate 210 is used as a channel layer.

Referring to FIG. 9, a channel supply layer 130 may be on the substrate 210. The substrate 210 may include a first semiconductor material as a channel material. Here, the first semiconductor material may include a Group III-V compound semiconductor material, but is not limited thereto. For example, the substrate 210 may include a GaN-based material.

The channel supply layer 130 may induce 2DEG in the substrate 210. The channel supply layer 130 may include a second semiconductor material that is different from the first semiconductor material of the substrate 210. A source electrode 171 and a drain electrode 172 may be on the substrate 210 at both sides of the channel supply layer 130.

A depletion forming layer 140 may be on the channel supply layer 130. Here, a protrusion 140a may be formed on a middle portion of the depletion forming layer 140, and a first gate electrode 150 may be on an upper surface of the protrusion 140a. In addition, a second gate electrode 160 may be on the depletion forming layer 140 to cover the first gate electrode 150. Because the depletion forming layer 140, the first gate electrode 150, and the second gate electrode 160 have been described above, descriptions thereof will be omitted.

Figure 10:
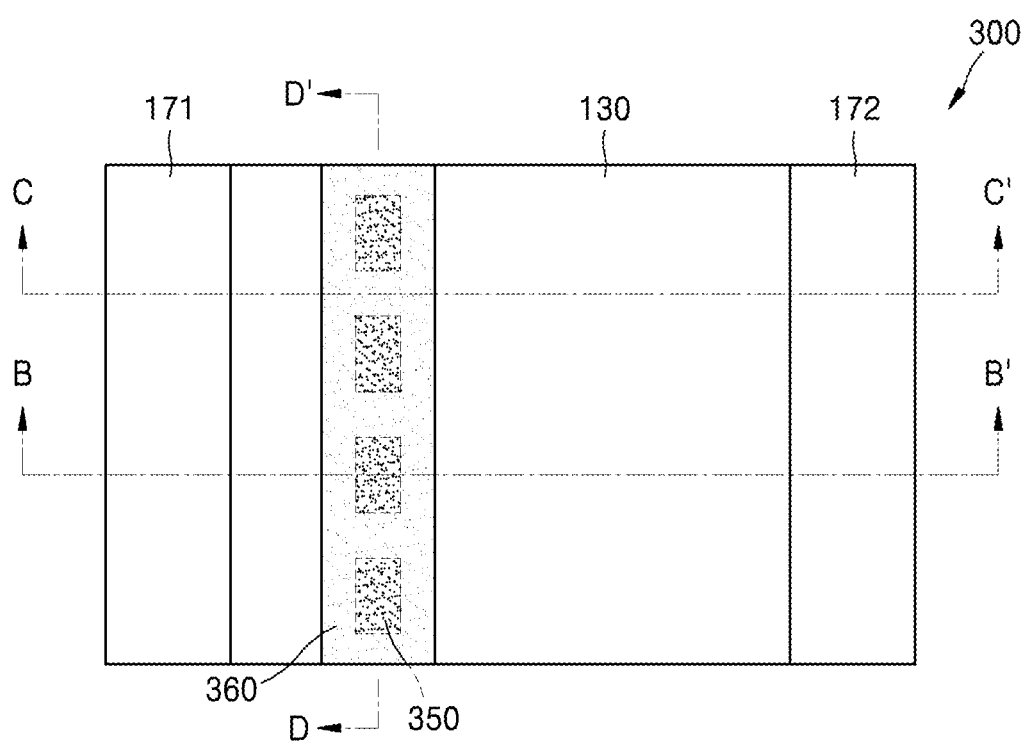
FIG. 10 is a plan view illustrating a high electron mobility transistor according to another example embodiment.
Figure 11:
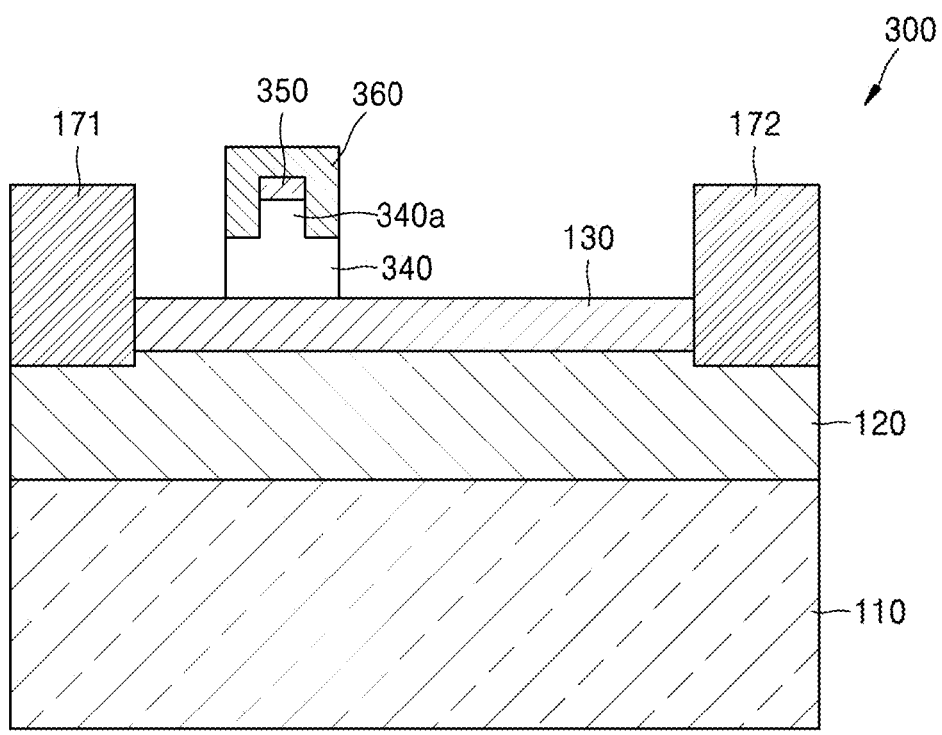
FIG. 11 is a cross-sectional view taken along line B-B' of FIG. 10.
Figure 12:
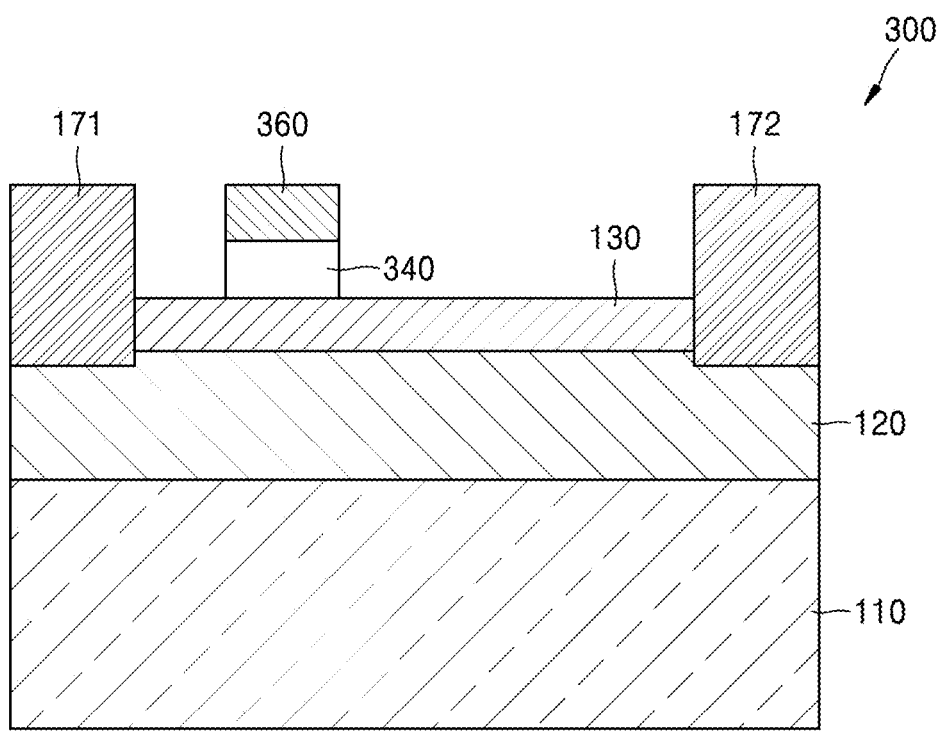
FIG. 12 is a cross-sectional view taken along line C-C' of FIG. 10.
Figure 13:
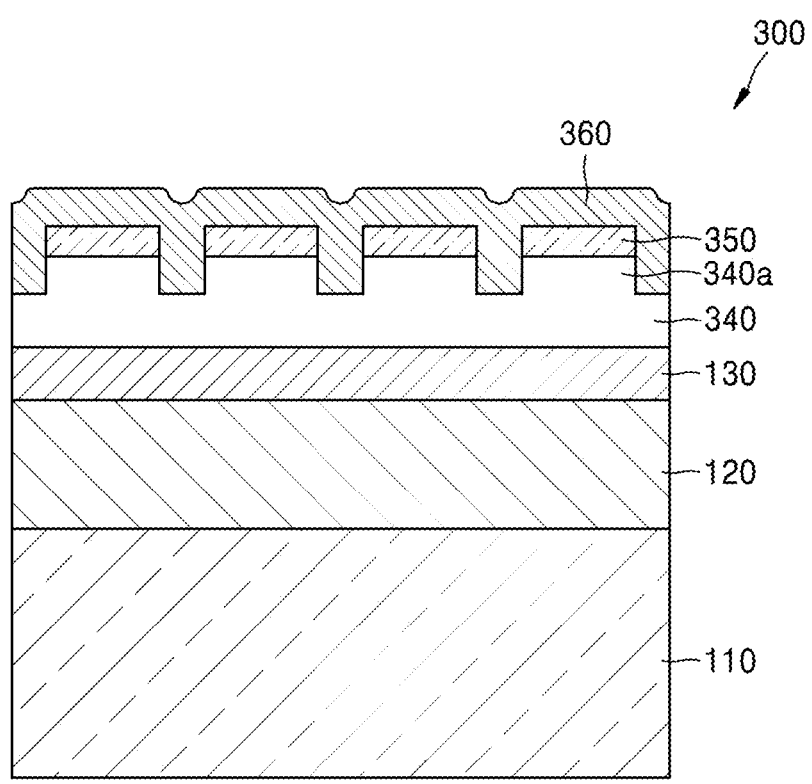
FIG. 13 is a cross-sectional view taken along line D-D' of FIG. 10.

FIG. 10 is a plan view illustrating a high electron mobility transistor 300 according to another example embodiment. FIG. 11 is a cross-sectional view taken along line B-B' of FIG. 10, FIG. 12 is a cross-sectional view taken along line C-C' of FIG. 10, and FIG. 13 is a cross-sectional view taken along line D-D' of FIG. 10. Hereinafter, differences from the above-described embodiments will be mainly described.

Referring to FIGS. 10 to 13, a depletion forming layer 340 may be on a channel supply layer 130 between a source electrode 171 and a drain electrode 172. Here, the depletion forming layer 340 may be of a one-piece type extending in a direction parallel to the source electrode 171 and the drain electrode 172.

A plurality of protrusions 340a may be formed in a middle region on an upper surface of the depletion forming layer 340. Here, the plurality of protrusions 340a may be separated from each other at intervals in a direction parallel to the source and drain electrodes 171 and 172. The height of and/or spacing between the plurality of protrusions may be predetermined. The depletion forming layer 340 may include a p-type semiconductor material. For example, the depletion forming layer 340 may be a p-GaN layer.

A gate electrode may be on the depletion forming layer 340. The gate electrode may include a plurality of first gate electrodes 350 and a second gate electrode 360. The first gate electrodes 350 may be on the protrusions 340a of the depletion forming layer 340, respectively. Here, the first gate electrodes 350 are in contact with upper surfaces of the protrusions 340a of the depletion forming layer 340, respectively. The first gate electrodes 150 may form ohmic contacts with the depletion forming layer 340, for example, respectively with the protrusions 340a of the depletion forming layer 340.

The second gate electrode 360 may be on the depletion forming layer 340 to cover the first gate electrodes 350. The second gate electrode 360 may be of a one-piece type extending in a direction parallel to the source electrode 171 and the drain electrode 172. Here, the second gate electrode 360 is in contact with lateral surfaces of the protrusions 340a of the depletion forming layer 340 and the upper surface of the depletion forming layer 340 adjacent to the protrusions 340a. The second gate electrode 360 may form a Schottky contact with the depletion forming layer 340.

When a high voltage is applied to the gate electrode to turn on the high electron mobility transistor 300, a depletion region may expand at a Schottky junction between the depletion forming layer 340 and the second gate electrode 360 such that the second gate electrode 360 may have a function of preventing an increase in the leakage of current through the gate electrode.

Figure 14:
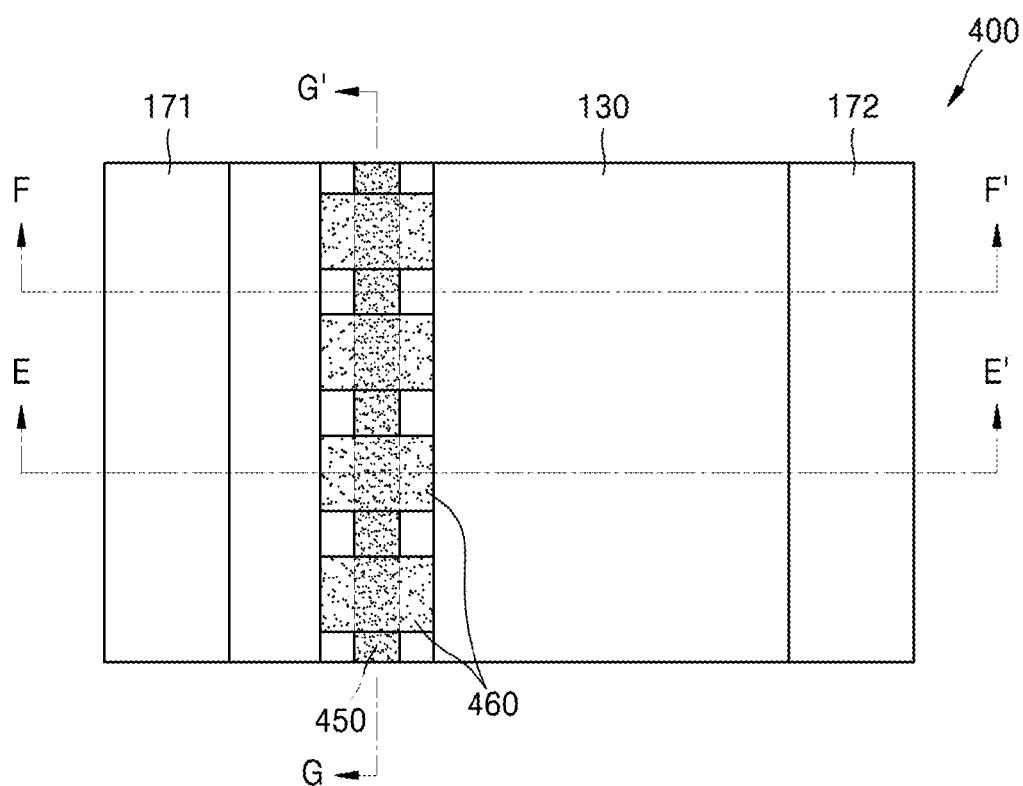
FIG. 14 is a plan view illustrating a high electron mobility transistor according to another example embodiment.
Figure 15:
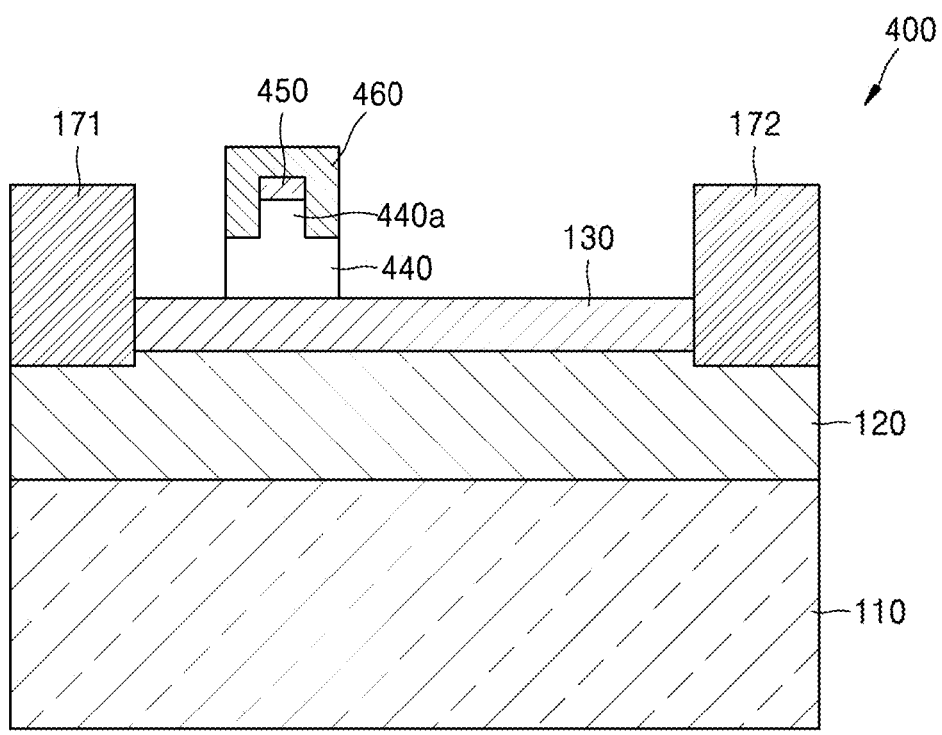
FIG. 15 is a cross-sectional view taken along line E-E' of FIG. 14.
Figure 16:
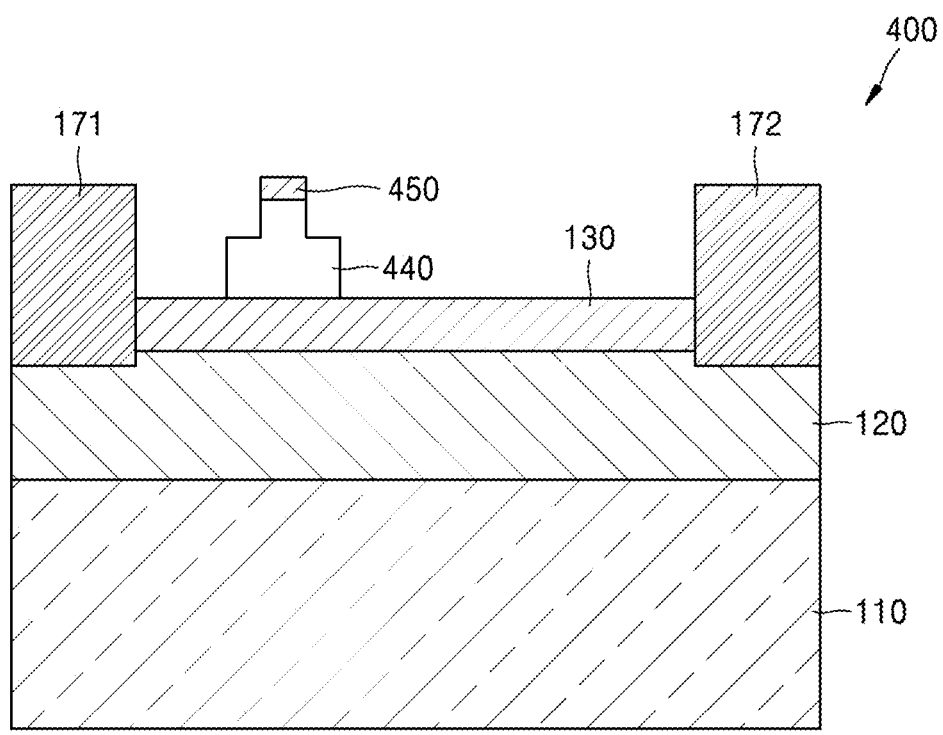
FIG. 16 is a cross-sectional view taken along line F-F' of FIG. 14.
Figure 17:
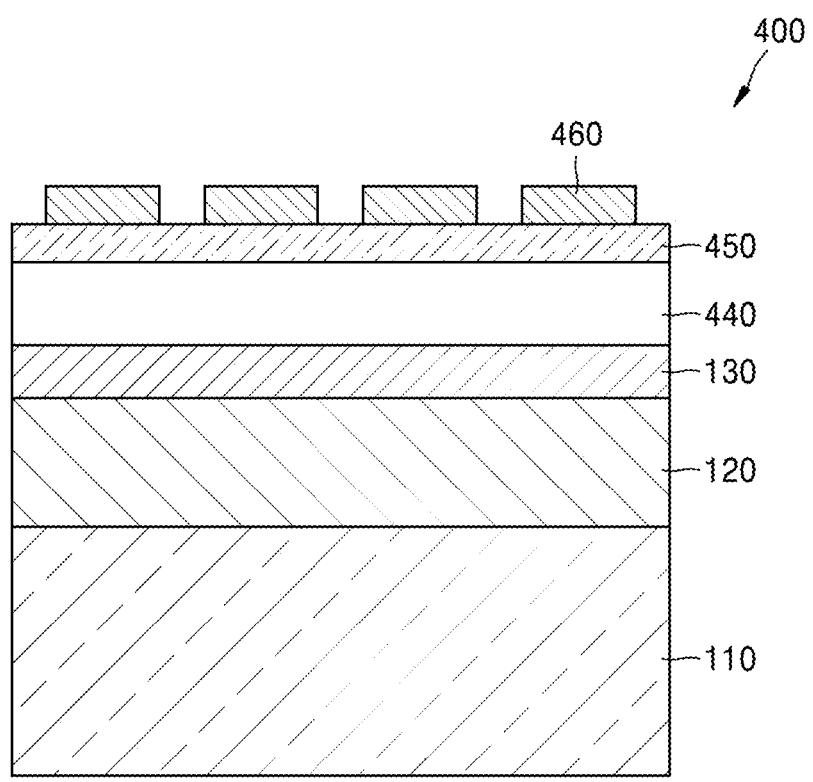
FIG. 17 is a cross-sectional view taken along line G-G' of FIG. 14.

FIG. 14 is a plan view illustrating a high electron mobility transistor 400 according to another example embodiment. FIG. 15 is a cross-sectional view taken along line E-E' of FIG. 14, FIG. 16 is a cross-sectional view taken along line F-F' of FIG. 14, and FIG. 17 is a cross-sectional view taken along line G-G' of FIG. 14.

Referring to FIGS. 14 to 17, a depletion forming layer 440 may be on a channel supply layer 130 between a source electrode 171 and a drain electrode 172. Here, the depletion forming layer 440 may be a one-piece type extending in a direction parallel to the source electrode 171 and the drain electrode 172.

A protrusion 440a may be formed in a middle region on an upper surface of the depletion forming layer 440. Here, the protrusion 440a may be of a one-piece type extending in a direction parallel to the source and drain electrodes 171 and 172. The depletion forming layer 440 may include a p-type semiconductor material. For example, the depletion forming layer 440 may be a p-GaN layer.

A gate electrode may be on the depletion forming layer 440. The gate electrode may include a first gate electrode 450 and a plurality of second gate electrodes 460. The first gate electrode 450 is of a one-piece type extending along the protrusion 440a of the depletion forming layer 440. Here, the first gate electrode 450 is in contact with an upper surface of the protrusion 440a of the depletion forming layer 440. The first gate electrode 450 may form an ohmic contact with the depletion forming layer 440.

The plurality of second gate electrodes 460 may be on an upper surface of the depletion forming layer 440 and may cover portions of the first gate electrode 450. The second gate electrodes 460 may be spaced apart from each other along the first gate electrode 450. Here, each of the second gate electrodes 460 may be in contact with the upper surface of the protrusion 440a of the depletion forming layer 440. Each of the second gate electrodes 460 may form a Schottky contact with the depletion forming layer 440.

Figure 18:
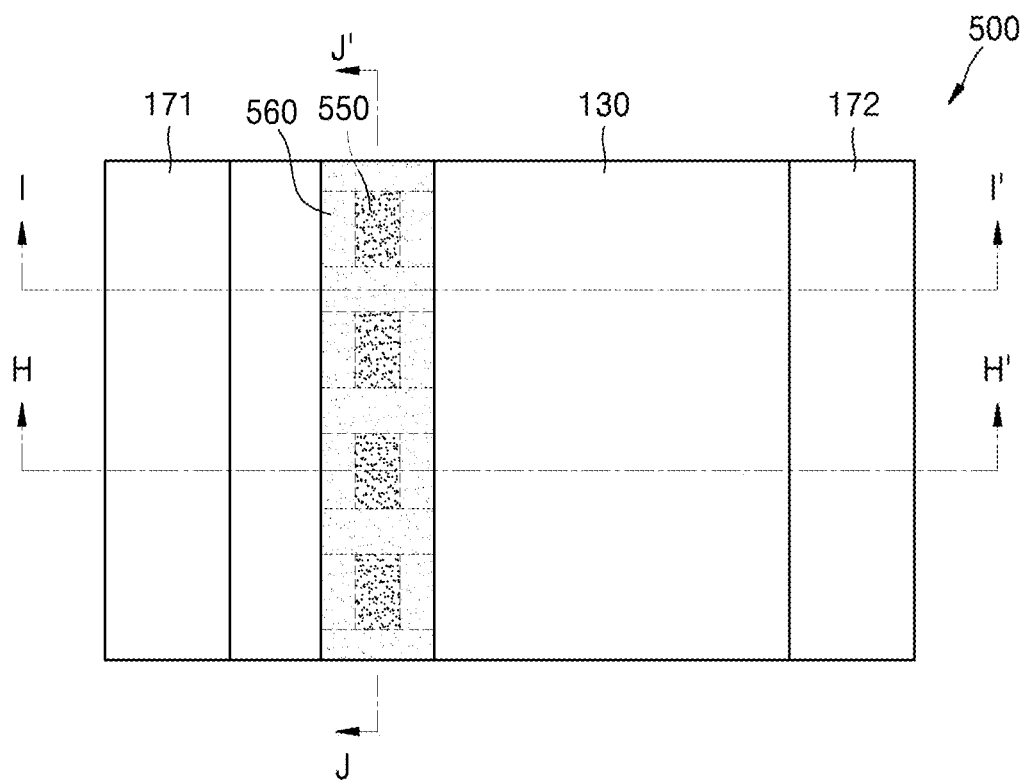
FIG. 18 is a plan view illustrating a high electron mobility transistor according to another example embodiment.
Figure 19:
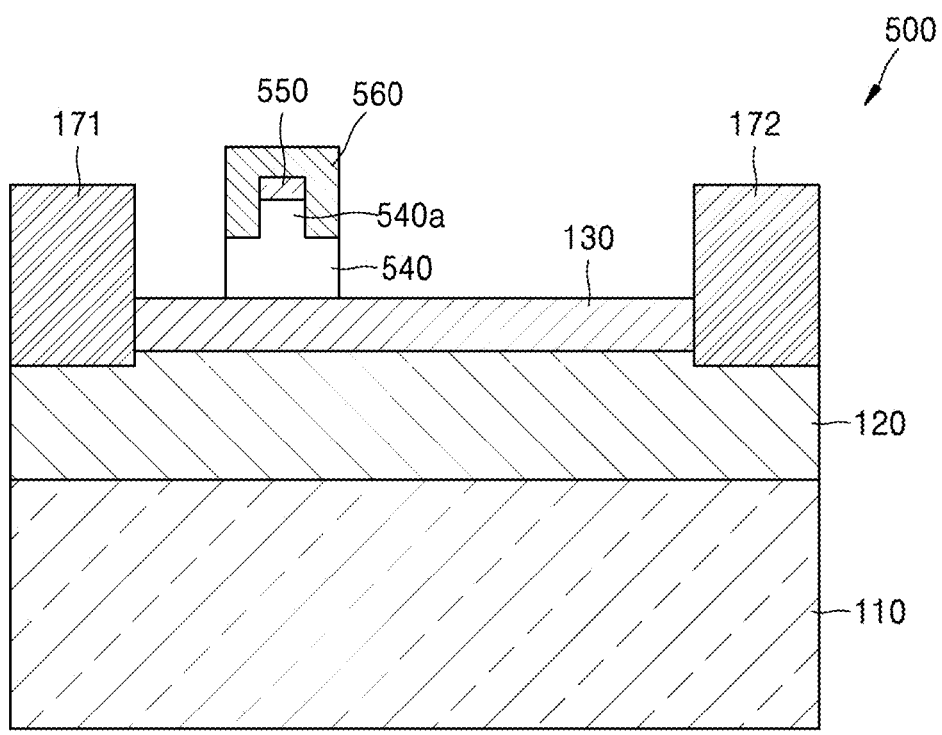
FIG. 19 is a cross-sectional view taken along line H-H' of FIG. 18.
Figure 20:
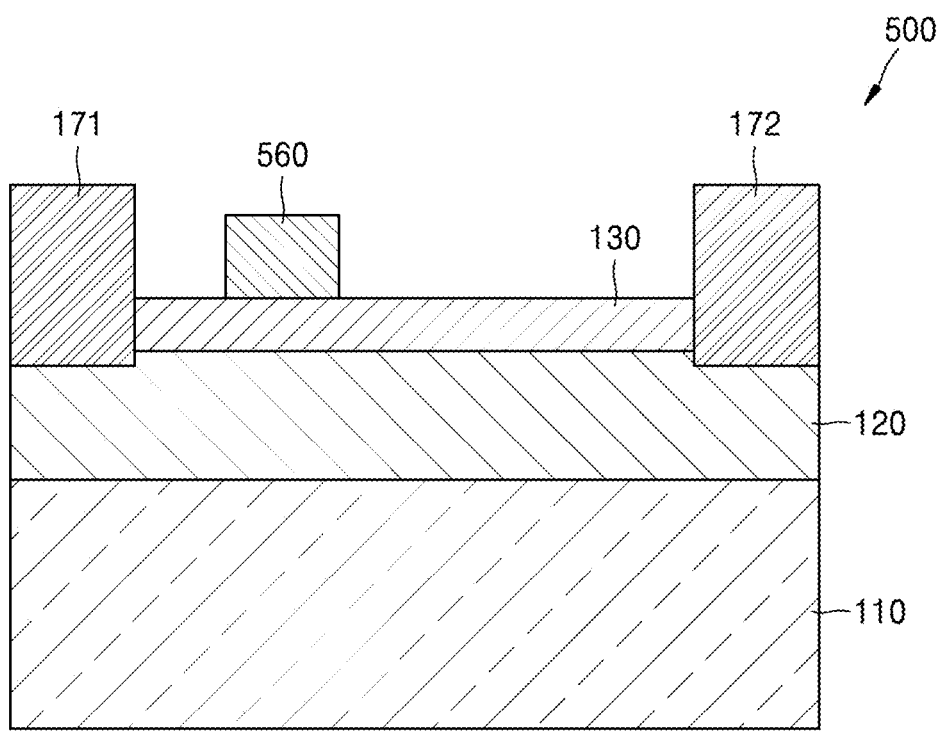
FIG. 20 is a cross-sectional view taken along line I-I' of FIG. 18.
Figure 21:
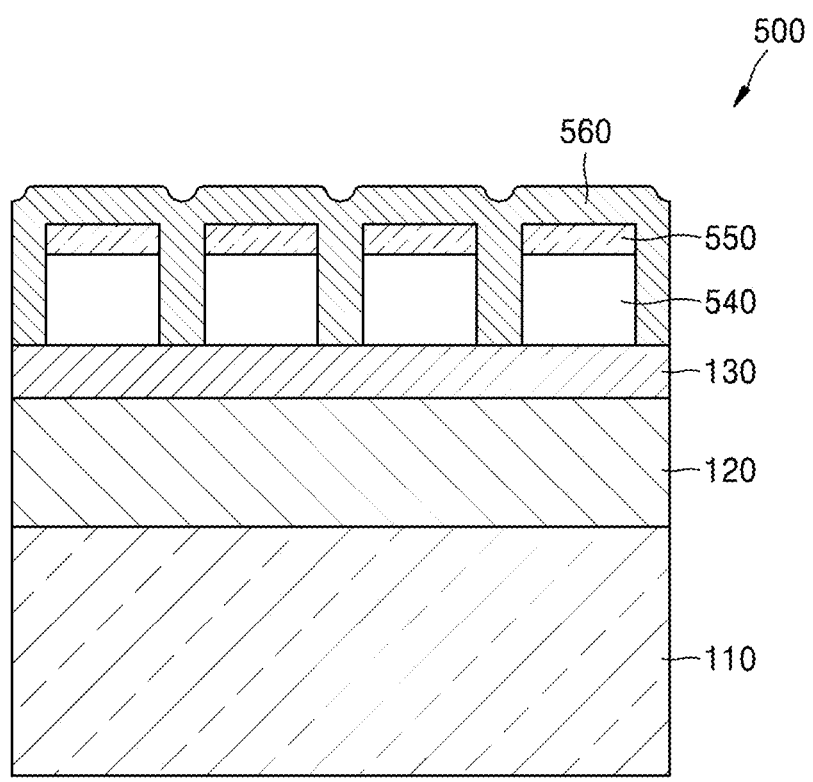
FIG. 21 is a cross-sectional view taken along line J-J' of FIG. 18.

FIG. 18 is a plan view illustrating a high electron mobility transistor 500 according to another example embodiment. FIG. 19 is a cross-sectional view taken along line H-H' in FIG. 18, FIG. 20 is a cross-sectional view taken along line I-I' in FIG. 18, and FIG. 21 is a cross-sectional view taken along line J-J' in FIG. 18.

Referring to FIGS. 18 to 21, a plurality of depletion forming layers 540 may be on a channel supply layer 130 between a source electrode 171 and a drain electrode 172. Here, the depletion forming layers 540 may be separated apart from each other a direction parallel to the source electrode 171 and the drain electrode 172.

The depletion forming layers 540 adjacent to each other may be separated apart from each other at intervals such that depletion regions may be formed in a 2DEG in the channel layer 120. For example, the distance between the depletion forming layers 540 separated apart from each other may be about 1 μm or less. However, this is a non-limiting example. For example, the distance between the depletion forming layers 540 separated apart from each other may be about 200 nm or less.

A protrusion 540a may be in a middle region on an upper surface of each of the depletion forming layers 540. The depletion forming layers 540 may include a p-type semiconductor material. For example, the depletion forming layers 540 may be p-GaN layers.

A gate electrode is on the depletion forming layers 540. The gate electrode may include a plurality of first gate electrodes 550 and a second gate electrode 560. The first gate electrodes 550 may be on upper surfaces of the protrusions 540a of the depletion forming layers 540, respectively. The first gate electrodes 550 may form ohmic contacts respectively with the depletion forming layers 540.

The second gate electrode 560 may be on the depletion forming layers 540 and the channel supply layer 130, and may cover the first gate electrodes 550. The second gate electrode 560 is of a one-piece type extending in a direction parallel to the source electrode 171 and the drain electrode 172. The second gate electrode 560 may be on each of the depletion forming layers 540 at both sides of the protrusion 540a and both sides of the first gate electrode 550 and may fill the space between the depletion forming layers 540. The second gate electrode 560 may form Schottky contacts with the depletion forming layers 540.

Figure 22:
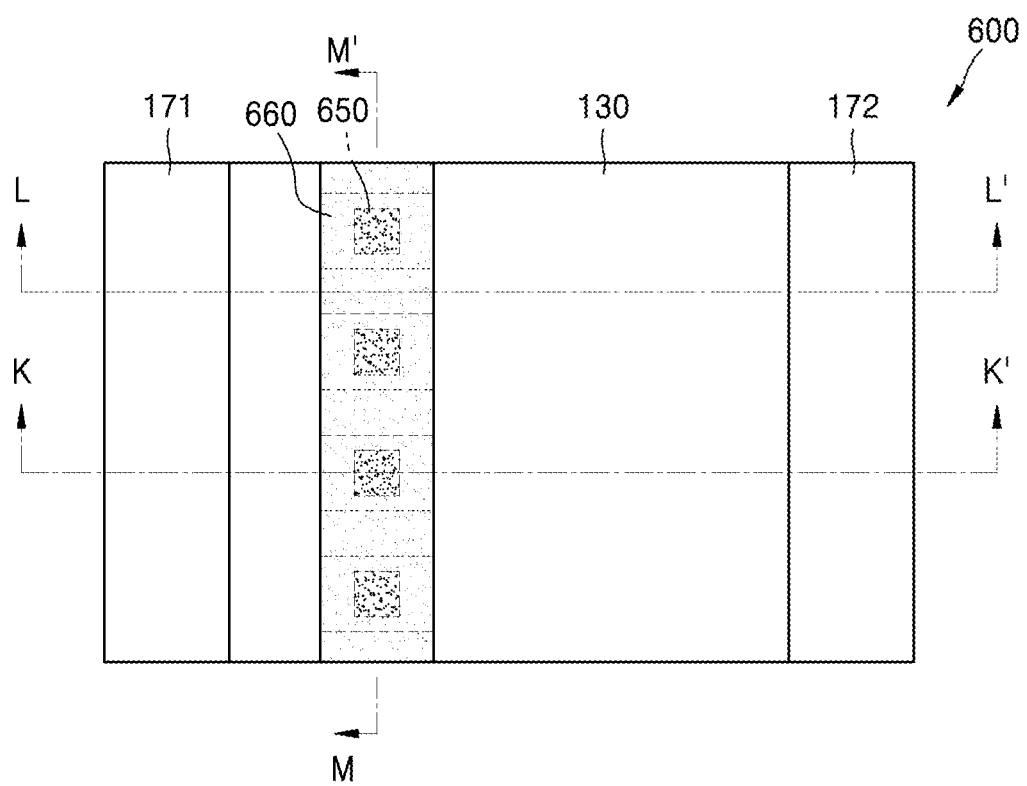
FIG. 22 is a plan view illustrating a high electron mobility transistor according to another example embodiment.
Figure 23:
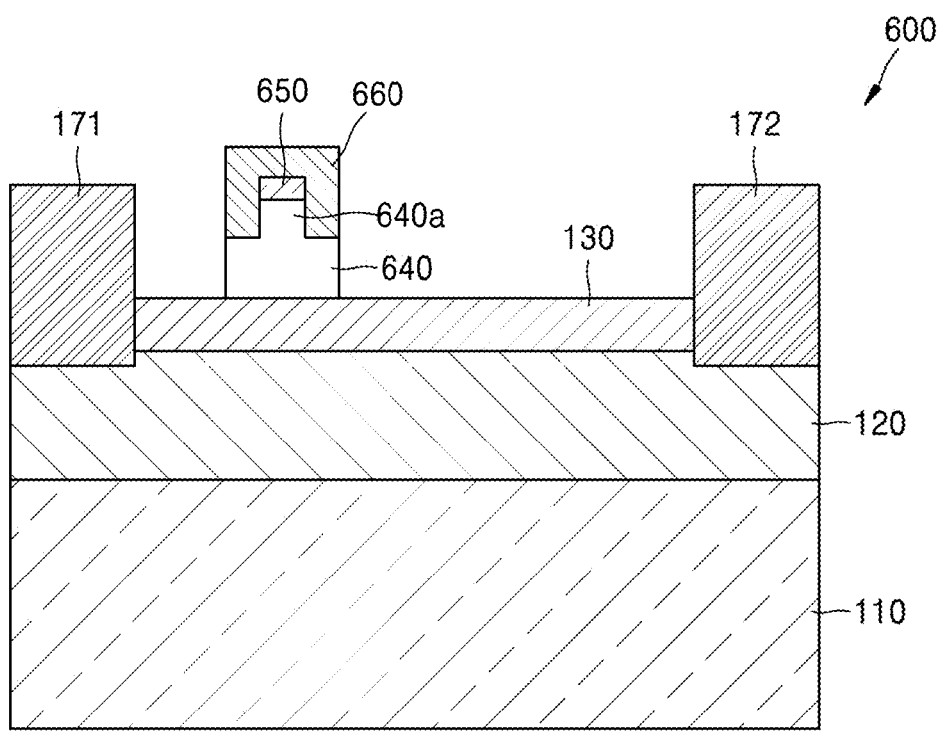
FIG. 23 is a cross-sectional view taken along line K-K' of FIG. 22.
Figure 24:
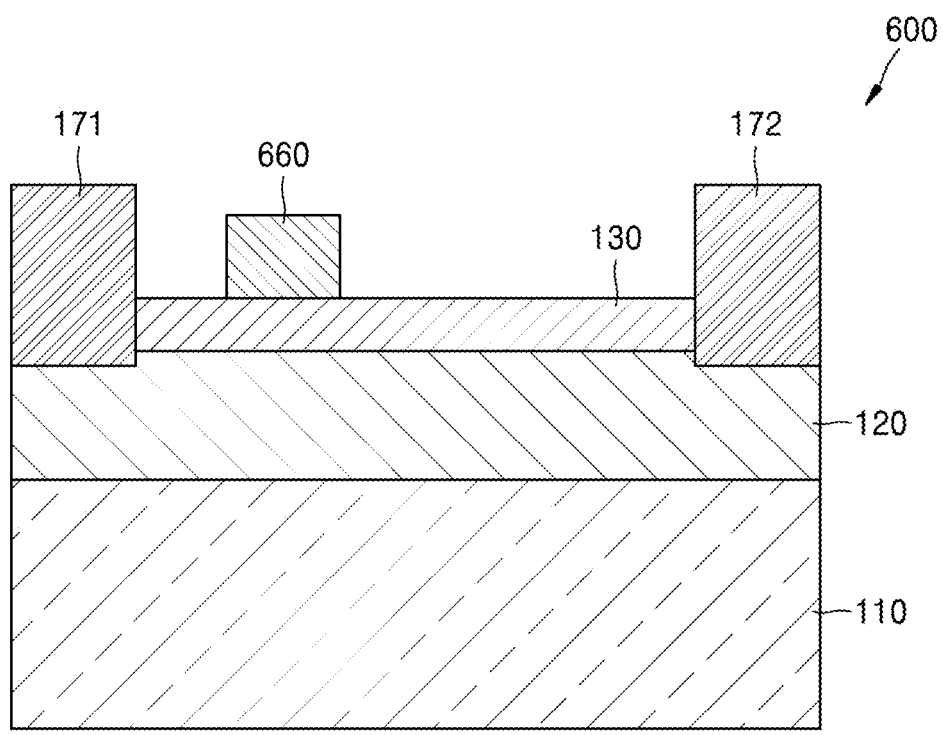
FIG. 24 is a cross-sectional view taken along line L-L' of FIG. 22.
Figure 25:
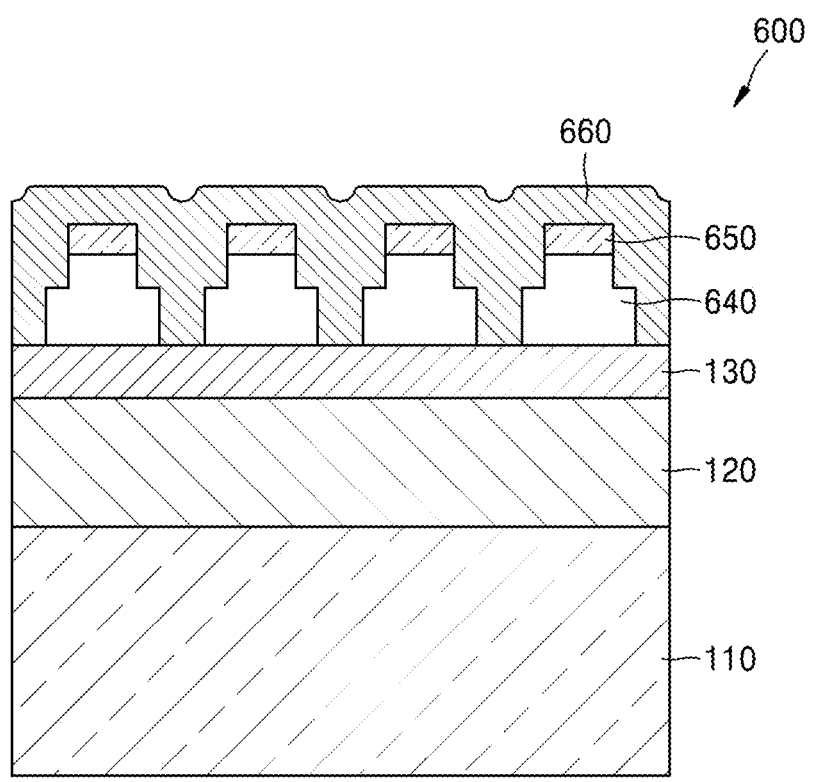
FIG. 25 is a cross-sectional view taken along line M-M' of FIG. 22.

FIG. 22 is a plan view illustrating a high electron mobility transistor 600 according to another example embodiment. FIG. 23 is a cross-sectional view taken along line K-K' of FIG. 22, FIG. 24 is a cross-sectional view taken along line L-L' of FIG. 22, and FIG. 25 is a cross-sectional view taken along line M-M' of FIG. 22.

Referring to FIGS. 22 to 25, a plurality of depletion forming layers 640 may be on a channel supply layer 130 between a source electrode 171 and a drain electrode 172. Here, the depletion forming layers 640 may be spaced apart from each other a direction parallel to the source electrode 171 and the drain electrode 172.

A protrusion 640a may be in a middle region on an upper surface of each of the depletion forming layers 640. The depletion forming layers 640 may include a p-type semiconductor material. For example, the depletion forming layer 640 may be a p-GaN layer.

A gate electrode may be on the depletion forming layers 640. The gate electrode may include a plurality of first gate electrodes 650 and a second gate electrode 660. The first gate electrodes 650 may be on upper surfaces of the protrusions 640a of the depletion forming layers 640, respectively. The first gate electrodes 650 may form ohmic contacts respectively with the depletion forming layers 640.

The second gate electrode 660 may be on the depletion forming layers 640 and the channel supply layer 130 to cover the first gate electrodes 650. The second gate electrode 660 is of a one-piece type extending in a direction parallel to the source electrode 171 and the drain electrode 172. The second gate electrode 660 may surround the protrusion 640a and the first gate electrode 650 on each of the depletion forming layers 640. The second gate electrode 660 may form Schottky contacts respectively with the depletion forming layers 640.

Figure 26:
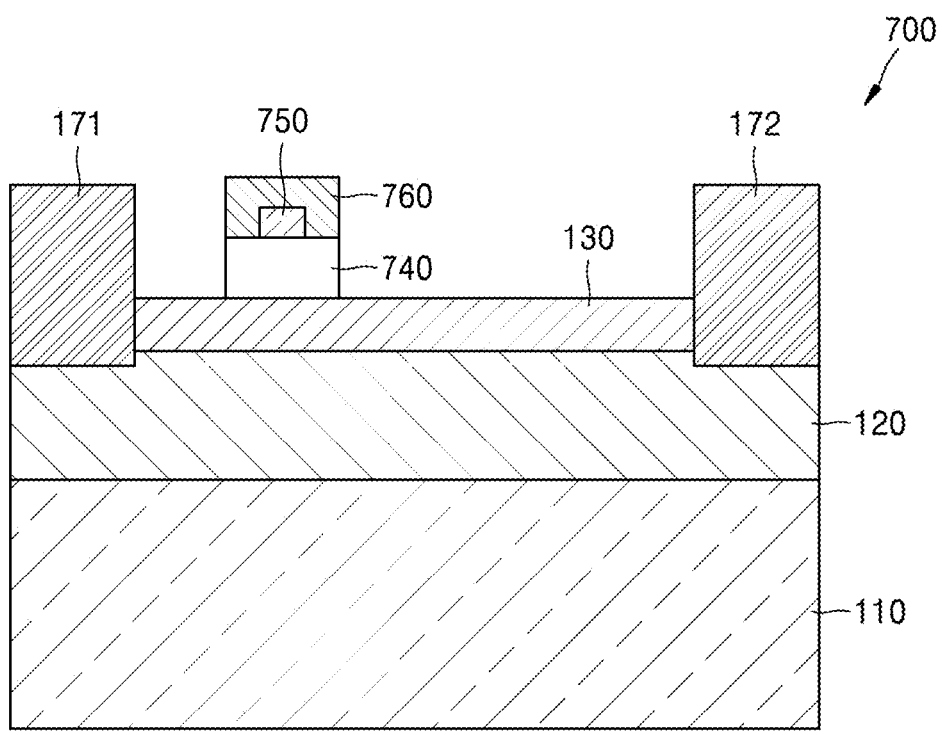
FIG. 26 is a cross-sectional view illustrating a high electron mobility transistor according to another example embodiment.

FIG. 26 is a cross-sectional view illustrating a high electron mobility transistor 700 according to another example embodiment. The plan view of the high electron mobility transistor 700 illustrated in FIG. 26 may be the same as the plan view shown in FIG. 1. In this case, the high electron mobility transistor 700 shown in FIG. 26 is the same as the high electron mobility transistor 100 shown in FIGS. 1 and 2 except that no protrusion is formed on a depletion forming layer 740.

Referring to FIG. 26, the depletion forming layer 740 may be on a channel supply layer 130 in a direction parallel to a source electrode 171 and a drain electrode 172. A first gate electrode 750 may be in a middle region on an upper surface of the depletion forming layer 740, and a second gate electrode 760 may be on the upper surface of the depletion forming layer 740 to cover the first gate electrode 750.

The first gate electrode 750 may be in contact with the middle region of the upper surface of the depletion forming layer 740, and the second gate electrode 760 may be in contact with the upper surface of the depletion forming layer 740 in regions adjacent to both sides of the first gate electrode 750. The first gate electrode 750 may form an ohmic contact with the depletion forming layer 740, and the second gate electrode 760 may form a Schottky contact with the depletion forming layer 740.

According to the present embodiment, when a high voltage is applied to a gate electrode, a depletion region expands at a Schottky junction between the second gate electrode 760 and the depletion forming layer 740, and thus current leaking from the gate electrode to the depletion forming layer 740 may be limited. In addition, the amount of leakage current may be adjusted by changing the area ratio of the Schottky contact.

The plan view of the high electron mobility transistor 700 illustrated FIG. 26 may be the same as the plan view shown in FIG. 10. In this case, the depletion forming layer 740 may be of a one-piece type extending in a direction parallel to the source electrode 171 and the drain electrode 172. A plurality of first gate electrodes 750 separated apart from each other may be in a middle region on the upper surface of the depletion forming layer 740, and a second gate electrode 760 is on the depletion forming layer 740 to cover the first gate electrodes 750.

The plan view of the high electron mobility transistor 700 illustrated FIG. 26 may be the same as the plan view shown in FIG. 14. In this case, the depletion forming layer 740 may be of a one-piece type extending in a direction parallel to the source electrode 171 and the drain electrode 172, and a first gate electrode 750 is in a middle region on the upper surface of the depletion forming layer 740. In addition, a plurality of second gate electrodes 760 may be separated apart from each other on the upper surface of the depletion forming layer 740 to cover portions of the first gate electrode 750.

The plan view of the high electron mobility transistor 700 illustrated in FIG. 26 may be the same as the plan view shown in FIG. 18. In this case, a plurality of depletion forming layers 740 may be on the channel supply layer 130 in such a manner that the depletion forming layers 740 are separated apart from each other at predetermined intervals in a direction parallel to the source electrode 171 and the drain electrode 172. A plurality of first gate electrodes 750 may be in middle regions on upper surfaces of the depletion forming layers 740, respectively.

A second gate electrode 760 may be on the depletion forming layers 740 and the channel supply layer 130 to cover the first gate electrodes 750. The second gate electrode 760 may be of a one-piece type extending in a direction parallel to the source electrode 171 and the drain electrode 172. The second gate electrode 760 may be at both sides of the first gate electrode 750 on each of the depletion forming layers 740. In addition, the plan view of the high electron mobility transistor 700 illustrated in FIG. 26 may be the same as the plan view shown in FIG. 22. In this case, a second gate electrode 760 may surround a first gate electrode 750 on each depletion forming layer 740.

Figure 27:
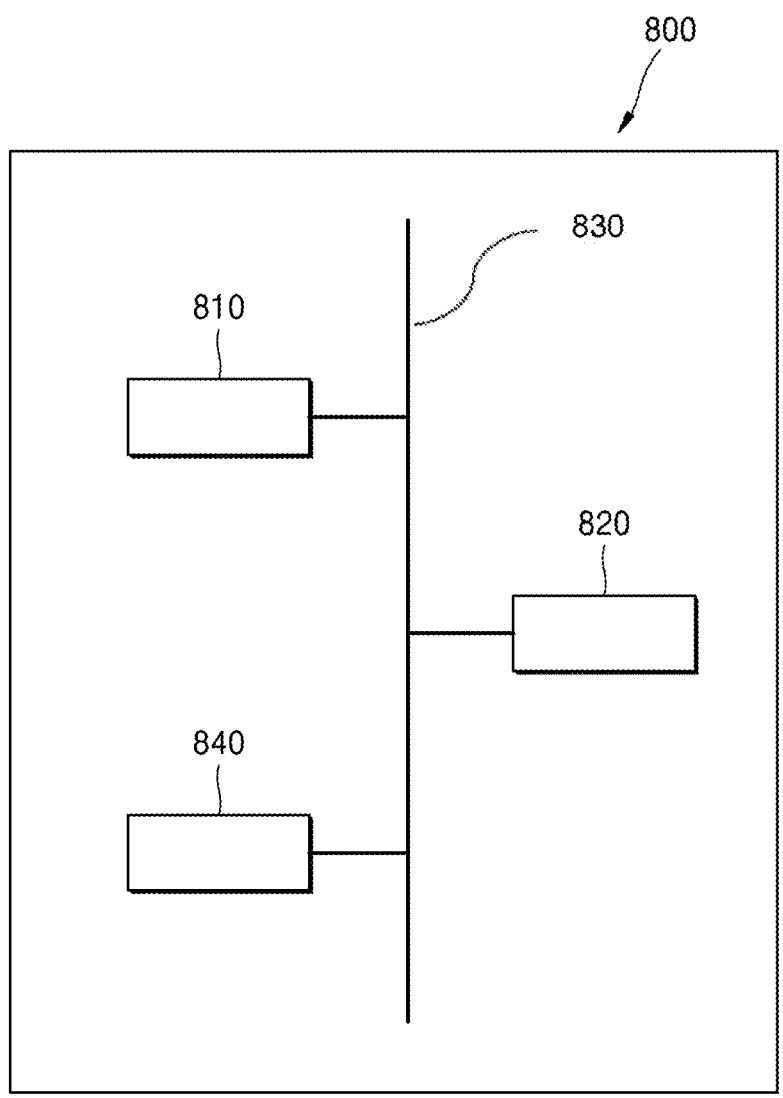
FIG. 27 shows a schematic of a circuit that may include the aforementioned electronic devices according to some example embodiments.

FIG. 27 shows a schematic of a circuit that may include the aforementioned electronic devices according to some example embodiments.

As shown, the electronic device 800 includes one or more electronic device components, including a processor (e.g., processing circuitry) 810 and a memory 820 that are communicatively coupled together via a bus 830.

The processing circuitry 810, may be included in, may include, and/or may be implemented by one or more instances of processing circuitry such as hardware including logic circuits, a hardware/software combination such as a processor executing software; or a combination thereof. For example, the processing circuitry 600 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 820 may include a non-transitory computer readable storage device, for example a solid state drive (SSD), storing a program of instructions, and the processing circuitry 600 may be configured to execute the program of instructions to implement the functionality of the electronic device 800.

In some example embodiments, the electronic device 800 may include one or more additional components 840, coupled to bus 830, which may include, for example, a power supply, a light sensor, a light-emitting device, any combination thereof, or the like. In some example embodiments, one or more of the processing circuitry 810, memory 820, and/or one or more additional components 840 may include any electronic device including electrodes, the first gate electrode configure to form an ohmic contact, and the second gate electrode configured to form a Schottky contact are on the depletion forming layer such that the one or more of the processing circuitry 810, memory 820, and/or one or more additional components 840, and thus, the electronic device 800, may include a high electron mobility transistor as described above.

According to one or more of the above-described example embodiments, the first gate electrode configured to form an ohmic contact and the second gate electrode configured to form a Schottky contact are on the depletion forming layer, and when a high voltage is applied to the gate electrode, a depletion region expands at the Schottky junction between the depletion forming layer and the second gate electrode such that current leaking through the gate electrode may not increase.

The amount of leakage current may be adjusted by controlling factors such as the area ratio and the height of the Schottky contact. For example, when a certain amount of leakage current is required to reduce the turn-on resistance of the high electron mobility transistor, gate current may be increased as desired by adjusting the area ratio and the height of the Schottky contact.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A high electron mobility transistor comprising:
a channel layer comprising a first semiconductor material;
a channel supply layer comprising a second semiconductor material and inducing 2-dimensional electron gas (2DEG) in the channel layer;
source and drain electrodes electrically connected to the 2DEG;
a depletion forming layer, including a protrusion on a middle portion of the depletion forming layer, on the channel supply layer, the depletion forming layer configured to form a depletion region in the 2DEG; and
a gate electrode on the depletion forming layer, the gate electrode including a first gate electrode and a second gate electrode, the first gate electrode on the protrusion and configured to form an ohmic contact with the depletion forming layer and the second gate electrode configured to form a Schottky contact with the depletion forming layer.

2. The high electron mobility transistor of claim 1, wherein the depletion forming layer comprises a p-type Group III-V nitride semiconductor.

3. The high electron mobility transistor of claim 1, wherein the depletion forming layer extends in a direction parallel to the source and drain electrodes.

4. The high electron mobility transistor of claim 3, wherein the depletion forming layer is one of a plurality of depletion forming layers, the plurality of depletion forming layers spaced apart from each other in the direction parallel to the source and drain electrodes.

5. The high electron mobility transistor of claim 3, wherein the protrusion extends in the direction parallel to the source and drain electrodes.

6. The high electron mobility transistor of claim 3, wherein the first gate electrode extends in a middle region on an upper surface of the depletion forming layer in the direction parallel to the source and drain electrodes.

7. The high electron mobility transistor of claim 6, wherein the second gate electrode is on the upper surface of the depletion forming layer and covers the first gate electrode.

8. The high electron mobility transistor of claim 7, wherein
the first gate electrode includes at least one of palladium and TiN,
the second gate electrode includes TiN.

9. The high electron mobility transistor of claim 6, wherein
the second gate electrode is one of a plurality of second gate electrodes, and
the plurality of second gate electrodes are spaced apart from each other on the upper surface of the depletion forming layer and cover portions of the first gate electrode.

10. The high electron mobility transistor of claim 3, wherein
the first gate electrode is one of a plurality of first gate electrodes, and
the plurality of first gate electrodes are spaced apart from each other in a middle region on an upper surface of the depletion forming layer in the direction parallel to the source and drain electrodes.

11. The high electron mobility transistor of claim 10, wherein the second gate electrode is on the upper surface of the depletion forming layer and covers the plurality of first gate electrodes.

12. The high electron mobility transistor of claim 1, wherein
the depletion forming layer is one of a plurality of depletion forming layers, and
the plurality of depletion forming layers are spaced apart from each other in a direction parallel to the source and drain electrodes.

13. The high electron mobility transistor of claim 12, wherein a plurality of protrusions are respectively on middle portions of the plurality of depletion forming layers in the direction parallel to the source and drain electrodes.

14. The high electron mobility transistor of claim 12, wherein
the first gate electrode is one of a plurality of first gate electrodes, and
the plurality of first gate electrodes are respectively in middle regions on upper surfaces of the plurality of depletion forming layers.

15. The high electron mobility transistor of claim 14, wherein the second gate electrode is on the upper surfaces of the plurality of depletion forming layers and covers the plurality of first gate electrodes.

16. The high electron mobility transistor of claim 1, wherein the first semiconductor material comprises a GaN-based material.

17. The high electron mobility transistor of claim 1, wherein the second semiconductor material comprises a nitride, the nitride including of at least one of aluminum (Al), gallium (Ga), indium (In), and boron (B).

18. The high electron mobility transistor of claim 17, wherein the nitride includes at least one of aluminum gallium nitride (AlGAN), aluminum indium nitride (AlInN), indium gallium nitride (InGAN), aluminum nitride (AlN), and aluminum indium gallium nitride (AlInGAN).

19. The high electron mobility transistor of claim 1, wherein a current between the source and drain electrodes is cut off when a voltage applied to the gate electrode is 0 V.

20. The high electron mobility transistor of claim 1, wherein the first semiconductor material and the second semiconductor material differ in at least one of their polarization characteristics, energy bandgaps, and lattice constants.

21. A method of manufacturing a high electron mobility transistor, the method comprising:
forming a channel layer and a channel supply layer;
forming a depletion forming layer on the channel supply layer;
forming a protrusion in a middle region on an upper surface of the depletion forming layer;
forming a first gate electrode on the protrusion of the depletion forming layer, the first gate electrode configured to form an ohmic contact; and
forming a second gate electrode on the depletion forming layer and the first gate electrode, the second gate electrode configured to form a Schottky contact with the depletion forming layer.

22. The method of claim 21, wherein the depletion forming layer comprises a p-type Group III-V nitride semiconductor.

23. The method of claim 21, wherein the first gate electrode is formed in a middle region on an upper surface of the depletion forming layer.

24. The method of claim 23, wherein the second gate electrode is formed on the depletion forming layer and covers the first gate electrode.

25. The high electron mobility transistor of claim 8, wherein when the first gate electrode includes TiN, a ratio of titanium to nitrogen in the first gate electrode is different from a ratio of titanium to nitrogen in the second gate electrode.

* * * * *